(12) United States Patent
Boivin et al.

(10) Patent No.: US 8,033,698 B2
(45) Date of Patent: Oct. 11, 2011

(54) INDICATOR DISPLAY ASSEMBLY FOR A VEHICLE REARVIEW MIRROR

(75) Inventors: Joseph Ivan Rodolph Boivin, Columbia, SC (US); Phillip Reep, Columbia, SC (US)

(73) Assignee: Lang-Mekra North America LLC, Ridgeway, SC (US)

( * ) Notice: Subject to any disclaimer, the term of this patent is extended or adjusted under 35 U.S.C. 154(b) by 436 days.

(21) Appl. No.: 12/322,463

(22) Filed: Feb. 4, 2009

(65) Prior Publication Data

US 2009/0201690 A1 Aug. 13, 2009

Related U.S. Application Data

(60) Provisional application No. 61/063,897, filed on Feb. 7, 2008.

(51) Int. Cl.
*B60Q 1/26* (2006.01)
(52) U.S. Cl. .............. 362/494; 362/249.02; 362/249.16; 362/487; 362/545
(58) Field of Classification Search .................. 362/227, 362/249.01–249.02, 249.06, 249.14, 487, 362/494, 543–546, 492
See application file for complete search history.

(56) References Cited

U.S. PATENT DOCUMENTS

| | | | |
|---|---|---|---|
| 5,575,177 A | 11/1996 | Poleschuk et al. | |
| 5,938,320 A | 8/1999 | Crandall | |
| 6,149,287 A | 11/2000 | Pastrick et al. | |
| 6,152,590 A | 11/2000 | Furst et al. | |
| 6,227,689 B1 | 5/2001 | Miller | |
| 6,264,353 B1 * | 7/2001 | Caraher et al. ................ | 362/494 |
| 6,347,880 B1 | 2/2002 | Furst et al. | |
| 7,142,345 B2 | 11/2006 | Bonardi et al. | |
| 2003/0007362 A1 | 1/2003 | Robison | |
| 2003/0063465 A1 | 4/2003 | McMillan et al. | |
| 2003/0179584 A1 | 9/2003 | Pond et al. | |
| 2005/0231334 A1 | 10/2005 | Stephens et al. | |
| 2006/0012990 A1 | 1/2006 | Walser et al. | |

* cited by examiner

*Primary Examiner* — Stephen F Husar
*Assistant Examiner* — Meghan Dunwiddie
(74) *Attorney, Agent, or Firm* — McNair Law Firm, P.A.; Seann P. Lahey

(57) ABSTRACT

An integrated light-emitting diode (LED) indicator display assembly having a carrier plate including a plurality of LED mounting steps. Electrical contact leads for LEDs carried on the mounting steps extend through openings in the mounting steps and out the bottom side of the carrier plate for engaging a metal fret to power the LED array. Preferably, a vibration dampening member is positioned between the LED and the LED mounting step, and a protective covering is applied over the metal fret along the bottom side of the carrier plate to enclose the metal fret and secures the metal fret in place.

20 Claims, 3 Drawing Sheets

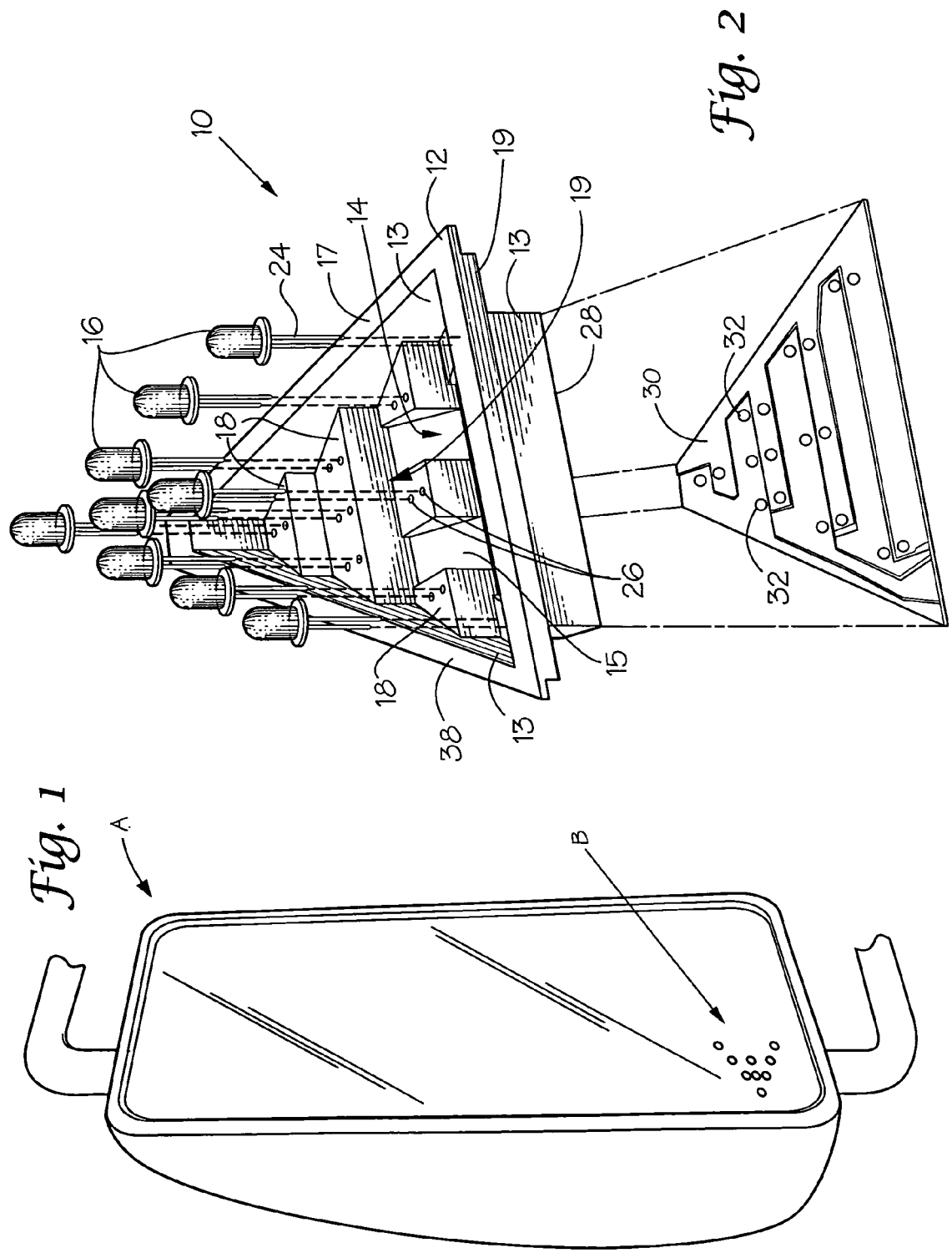

INDICATOR DISPLAY ASSEMBLY FOR A VEHICLE REARVIEW MIRROR

CROSS REFERENCE TO RELATED APPLICATION

This application claims priority from U.S. Provisional Application filed Feb. 7, 2008 under Application No. 61/063,897.

BACKGROUND OF THE INVENTION

1. Field of the Invention

The present invention relates to exterior vehicle rearview mirrors, and more particularly, to an integrated light-emitting diode (LED) indicator display assembly, such as a turn signal, that displays through the reflective mirrored surface for signaling adjacent vehicles.

2. Description of Related Art

Light-emitting diodes (LED) are commonly found in a variety of automotive lighting applications, from interior illumination to exterior signaling purposes. More recently, LEDs have been incorporated into exterior vehicle rearview mirrors to provide signaling capabilities to adjacent vehicles, as well as to back light various indicia to inform the vehicle driver about a particular condition, such as a proximity detector or like display.

As the brightness of LEDs has increased, it has become important to arrange the LEDs so as to avoid glaring the driver with light emitted from the vehicle's mirrors. The prior art is replete with various light control mechanisms, such as light control films, prisms, and slotted inserts for directing light away from the driver to avoid glare. While some of these applications are effective, they add complexity to the mirror assembly and increase the cost and time of production.

When multiple LEDs are arranged to provide an indicator display such as a turn signal, they are usually attached to silicone circuit board to power the LEDs. Each LED must be individually soldered to the board, which increases the complexity, cost and time of construction. Other LED arrangements which use stamped metal frets also require the LEDs to be individually attached to the fret, making this method equally as expensive and time consuming to manufacture.

Further, because the vehicle mirror assemblies are constantly subject to vibration, LEDs can be jarred loose from the support base. Also, the vibration can also lead to the position of the LEDs shifting, thus causing the light to be redirected in an undesirable direction.

Additionally, in an effort to save costs and reduce construction complexity, LED displays are typically left exposed on the interior of mirror housing. When moisture enters the mirror housing, the exposed components of the LED display are subject to damage and premature failure.

Accordingly, it is an object of the present invention to provide a simple cost effective LED signal display assembly for an exterior vehicle mirror that resolves the problems noted above with the prior art.

SUMMARY OF THE INVENTION

The above objective is accomplished according to the present invention by providing an indicator display assembly for mounting to an interior side of a vehicle mirror face, comprising a carrier plate adapted for mounting to a vehicle mirror face; a series of raised mounting steps included in the carrier plate; at least one LED is mounted on each of the mounting steps, wherein each LED mounted to one of the mounting steps includes a pair of electrical contact leads for extending through the carrier plate; a series of lead openings extending through the mounting steps from a top side of the carrier plate to a bottom side of the carrier plate, wherein the electrical contact leads of each LED extend through the lead openings in the mounting steps and out the bottom side of the carrier plate; and, a metal fret disposed on the bottom side of the carrier plate, the metal fret including a corresponding series of fret lead openings receiving the electrical contact leads from each LED, wherein the electrical contact leads are secured to the metal fret in electrical communication to secure each LED to the mounting steps and interconnect each LED to provide power for lighting each LED.

In a further embodiment, the display assembly includes a vibration dampening member disposed between each LED and the mounting steps for relieving stress tensions associated with assembly and damage from vehicle vibrations during use.

In a further embodiment, the display assembly includes a protective covering over the bottom side of the carrier plate and the metal fret to form a generally airtight seal with the carrier plate that encloses and secures the metal fret on the bottom side of the carrier plate.

In a further embodiment, the display assembly includes a stabilizing member securing each LED to the mounting steps on the top side of the carrier plate.

In a further embodiment, the stabilizing member comprises a silicone adhesive coating applied around a base portion of each LED to prevent accidental repositioning and provide anti-vibration resistance.

In a further embodiment, the mounting steps are skewed relative to the bottom side of the carrier plate so that each LED is carried at an angle for directing light in a desired direction through the vehicle mirror face when mounted.

BRIEF DESCRIPTION OF THE DRAWINGS

The construction designed to carry out the invention will hereinafter be described, together with other features thereof. The invention will be more readily understood from a reading of the following specification and by reference to the accompanying drawings forming a part thereof, wherein an example of the invention is shown and wherein:

FIG. 1 shows a perspective view of a rear-view mirror assembly having an indicator display assembly disposed on an interior side of the mirror face inside a housing assembly according to the present invention;

FIG. 2 shows a top side exploded view of the indicator display assembly according to the present invention;

DETAILED DESCRIPTION OF A PREFERRED EMBODIMENT

Figure 3:
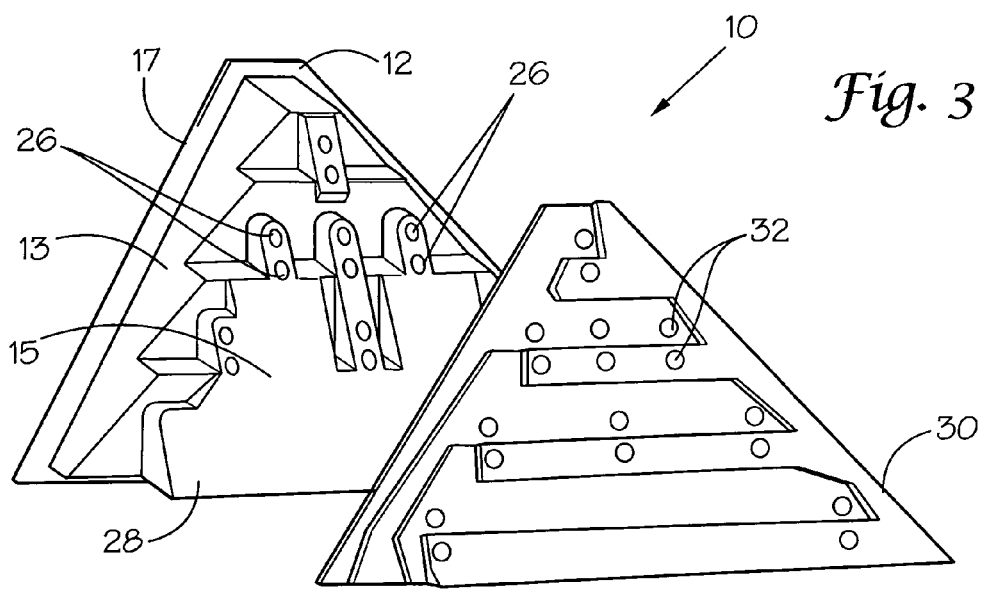
FIG. 3 shows a bottom side exploded view of the indicator display assembly according to the present invention.

With reference to the drawings, the invention will now be described in more detail. Referring to FIG. 1, an exterior rear view mirror assembly, designated generally as A, is shown having an illuminated indicator display B, showing through the reflective mirror face to signal information to adjacent vehicles, such as a turn signal, or to convey some other information to the driver.

Referring to FIG. 2, indicator display B is provided by an integrated light-emitting diode (LED) indicator display assembly, designated generally as 10. Display assembly 10 is constructed and arranged primarily to provide improved durability and ease of manufacturing as compared to existing LED vehicle mirror displays. The indicator assembly 10, which is illustrated in the form of a turn signal by way of example, includes a carrier plate 12 having a recessed interior portion, designated generally as 14. Carrier plate 12 is adapted for mounting to an interior side of a mirror face for displaying there through as illustrated in FIG. 1. Preferably, carrier plate 12 includes a perimeter wall 13 extending from a base surface 15 defining recessed interior portion 14. A flange 17 is carried on a top side, designated generally as 19, of perimeter wall 13 for providing a uniform engaging surface for mounting carrier plate 12 to a vehicle mirror face, as shown in FIGS. 4-6.

A plurality of raised mounting steps 18 protrude from base surface 15 in recessed interior portion 14 of carrier plate 12, which are skewed relative to base surface 15. A plurality of LEDs 16 are received within the recessed interior portion 14 of carrier plate 12 to provide the illuminated display functionality. Referring to FIGS. 4-6, LEDs 16 are carried on the angled mounting steps 18 so that each LED is disposed at an angle relative to an interior mirror face 22 when mounted for directing light in a desired direction, which is usually away from the vision of the driver and into areas adjacent the vehicle. Perimeter walls 13 help to control light bleed into unwanted viewing areas and prevent glaring the driver.

As illustrated, carrier plate 12 is formed generally in a triangular or arrowhead shape that promotes the arrangement of LEDs 16 into a desired arrow/chevron pattern. The shape of carrier plate 12 and arrangement of LEDs 16 therein will depend on the desired application. The illustrated arrangement in the Figures is for example only and the indicator display assembly 10 of the present invention is not limited to the specific shape and arrangement shown as would be recognized by a person of ordinary skill in the art.

Figure 4:
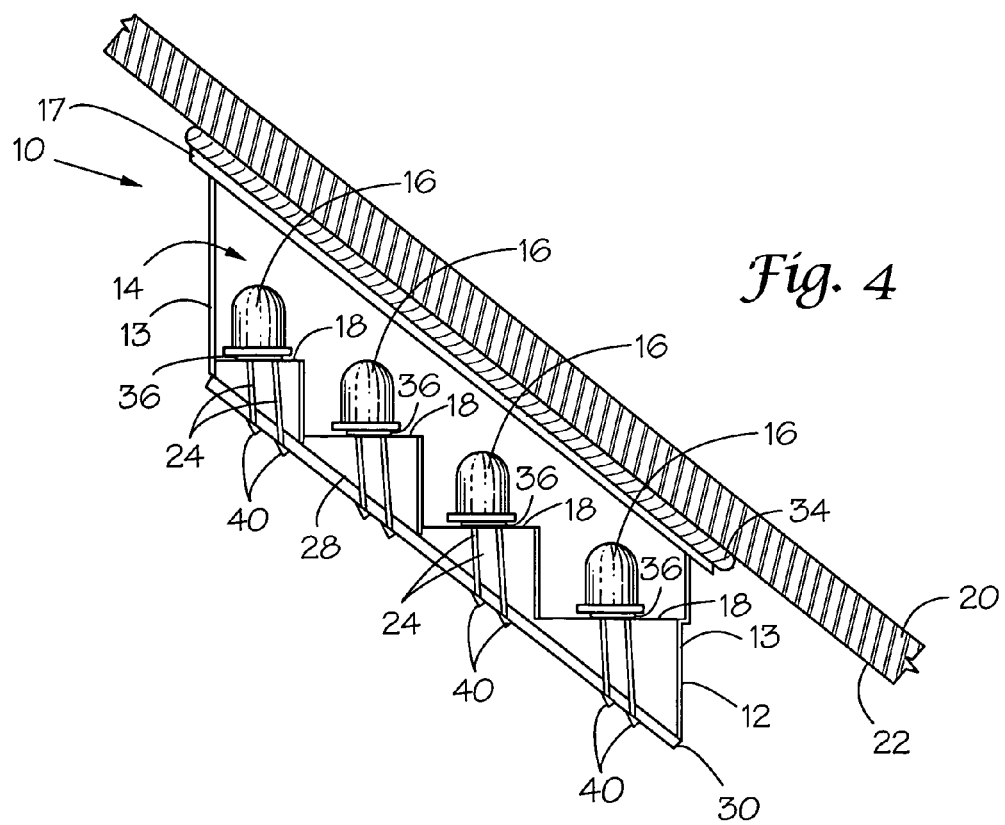
FIG. 4 shows a side cross-section view of the indicator display assembly according to the present invention.
Figure 5:
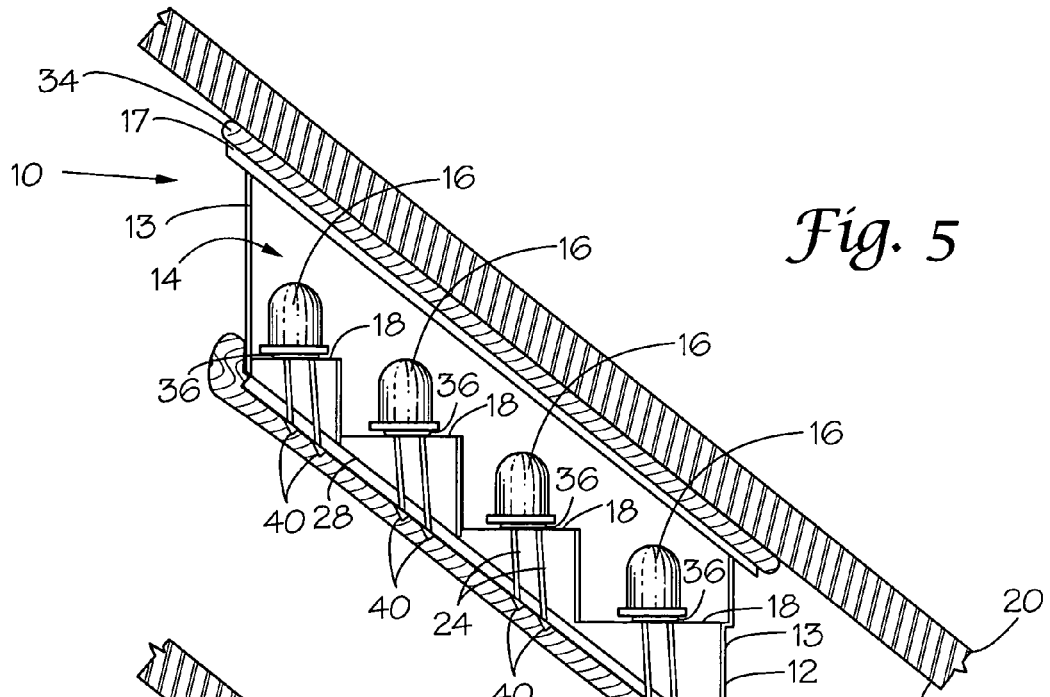
FIG. 5 shows a side cross-section view of a further embodiment of the indicator display assembly according to the present invention; and, FIG. 6 shows a side cross-section view of a further embodiment of the indicator display assembly according to the present invention.
Figure 6:
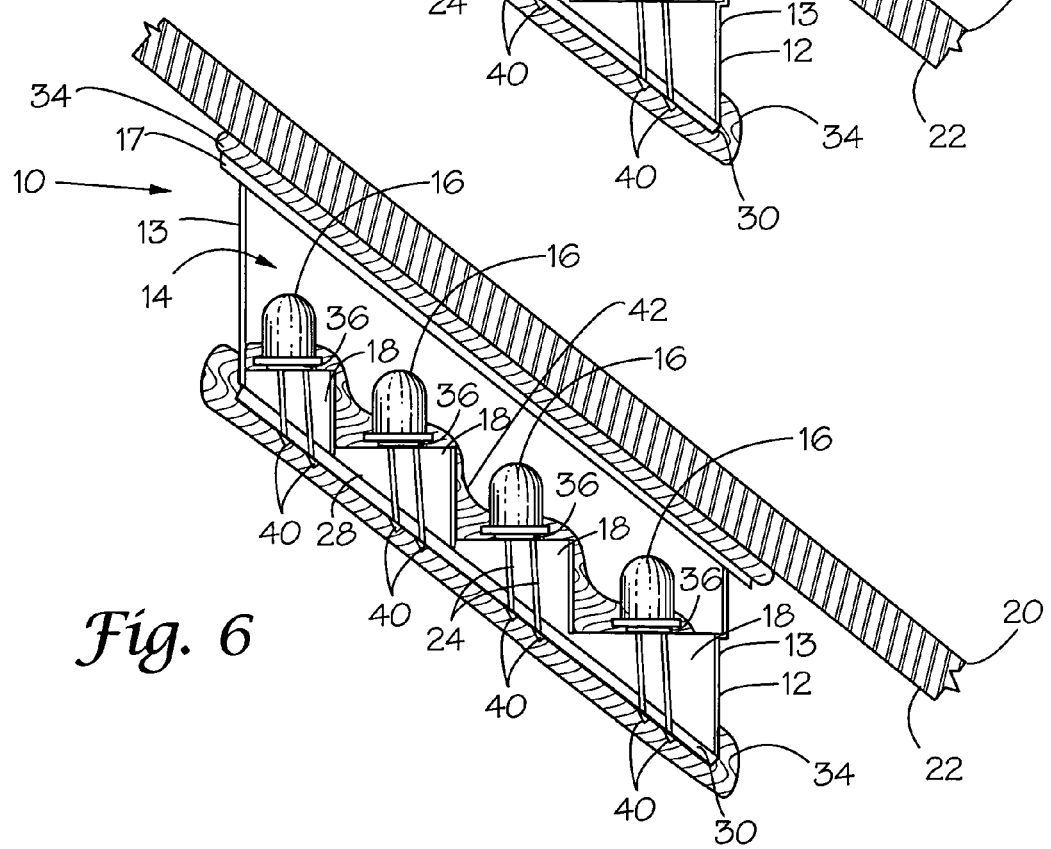

Referring to FIGS. 4-6, preferably, when display assembly 10 is mounted to mirror glass 20, LED mounting steps 18 are arranged at approximately a 45° angle to interior mirror face 22. The light emitted from LEDs 16 is sufficiently directed into the adjacent vehicle lane to avoid glaring the driver. This arrangement essentially eliminates the need for other forms of light control mechanism such as light control films to prevent interference with the driver's vision. Further, LED mounting steps 18 are staggered so that each LED 16 is carried approximately the same distance from interior mirror face 22 when mounted to provide a uniform display intensity through mirror glass 20 and reflective coatings applied thereto.

Referring to FIGS. 2-4, LEDs 16 are inserted into carrier plate 12 and rest on mounting steps 18 in the desired prearranged pattern. Electrical contact leads 24, representing a positive and negative electrical connection for each LED 16, extend from each of LEDs 16. Electrical contact leads 24 are extended through lead openings 26 in top side 19 of each mounting step 18, and extend out bottom side 28 of carrier plate 12 for each of mounting steps 18 for engaging a metal fret 30.

Metal fret 30 includes a corresponding series of fret lead openings 32 that align with lead openings 26 on bottom side 28 of carrier plate 12. Fret lead openings 32 receive electrical contact leads 24 for forming an electrical connection to power and operate LEDs 16. LED electrical contacts 24 are preferably wave soldered 40 to metal fret 30, which is operatively associated with the vehicle's electrical systems to power and operate the LEDs. To accomplish wave soldering of the LED electrical contacts 24 to metal fret 30, carrier plate 12 must be formed of a high temperature material sufficient to maintain its form under flowable soldering temperatures. Such high temperature plastics are well-known in the industry to those skilled in the art.

Preferably, metal fret 30 is applied and secured to bottom side 28 of carrier plate 12. It should be noted that metal fret 30 can be secured to carrier plate 12 in any number of known methods commonly used by those skilled in the art, for example, adhesive or screws, to prevent dislodging from carrier plate 12 and damaging electrical contact leads 24. However, once soldered to electrical contact leads 24, the assembly is secure and if the electrical contact leads are of sufficient caliber, additional securing methods may be unnecessary. Referring to FIGS. 5 and 6, in a preferred embodiment, metal fret 30 is secured to bottom side 28 of carrier plate 12 using a silicone type adhesive. Silicone adhesive 34 provides a protective coating that covers over metal fret 30 to form a generally airtight seal around bottom side 28 of carrier plate 12 to enclose metal fret 30 and electrical contact leads 24. Silicone adhesive 34 not only protects against moisture and other environmental corrosion concerns, but also helps secure metal fret 30 in place on carrier plate 12 to prevent damage to electrical contact leads 24. Further, silicone adhesive 34, or the like, can also be used to mount indicator display assembly 10 to interior mirror face 22. Accordingly, when silicone adhesive 34 is applied to bottom side 28 and around flange 17 on carrier 12, indicator display assembly 10 is completely sealed in an airtight arrangement against interior mirror face 22.

Referring to FIG. 6, in a further embodiment, it is preferred to include a stabilizing member 42, which may be an adhesive material such as a silicone adhesive, is provided around the base of each of LEDs 16 and over mounting steps 18. This helps to prevent accidental repositioning of LEDs 16 and provides further anti-vibration abilities.

Referring to FIGS. 2 and 3, in a preferred embodiment, metal fret 30 is constructed and arranged to operate LEDs 16 in a parallel powered arrangement. In this manner voltage requirements are reduced to maintain a consistent light intensity. Also, it provides a redundant operation in the event of an outage on part of the display so that at least a portion of the display may still operate to provide signals.

Referring to FIG. 4, in a preferred embodiment, a vibration dampening member 36, such as a rubber ring or like vibration absorber, is positioned between each LED 16 and each mounting step 18 within carrier plate 12 to relieve stress tensions associated with assembly and reduce damage from vehicle vibrations during use.

While a preferred embodiment of the invention has been described using specific terms, such description is for illustrative purposes only, and it is to be understood that changes and variations may be made without departing from the spirit or scope of the following claims.

What is claimed is:

1. An indicator display assembly for mounting to an interior side of a vehicle mirror face, comprising:
   a carrier plate adapted for mounting to a vehicle mirror face;
   a series of raised mounting steps included in said carrier plate;
   at least one LED mounted on each of said mounting steps, wherein each said LED mounted to one of said mounting steps includes a pair of electrical contact leads for extending through said carrier plate;

a series of lead openings extending through said mounting steps from a top side of said carrier plate to a bottom side of said carrier plate, wherein said electrical contact leads of each said LED extend through said lead openings in said mounting steps and out said bottom side of said carrier plate; and, a metal fret disposed on said bottom side of said carrier plate, said metal fret including a corresponding series of fret lead openings receiving said electrical contact leads from each said LED, wherein said electrical contact leads are secured to said metal fret in electrical communication to secure each said LED to said mounting steps and interconnect each said LED to provide power for lighting each said LED.

2. The display assembly of claim 1 including a vibration dampening member disposed between each said LED and said mounting steps for relieving stress tensions associated with assembly and damage from vehicle vibrations during use.

3. The display assembly of claim 1 including a protective covering over said bottom side of said carrier plate and said metal fret to form a generally airtight seal with said carrier plate that encloses and secures said metal fret on said bottom side of said carrier plate.

4. The display assembly of claim 1 including a stabilizing member securing each said LED to said mounting steps on said top side of said carrier plate.

5. The display assembly of claim 4 wherein said stabilizing member comprises a silicone adhesive coating applied around a base portion of each said LED to prevent accidental repositioning and provide anti-vibration resistance.

6. The display assembly of claim 1 wherein said mounting steps are skewed relative to said bottom side of said carrier plate so that each said LED is carried at an angle for directing light in a desired direction through said vehicle mirror face when mounted.

7. An indicator display assembly for mounting to an interior side of a vehicle mirror face, comprising:

a carrier plate having a perimeter wall extending from a base surface defining a recessed interior portion;

a flange carried on a top side of said perimeter wall providing a uniform engaging surface for mounting said carrier plate to a vehicle mirror face;

a plurality of mounting steps protruding from said base surface in said recessed interior portion of said carrier plate, wherein said mounting steps are skewed relative to said base surface of said carrier plate; and, a plurality of LEDs carried on said mounting steps so that each said LED is disposed at an angle relative to said vehicle mirror face when mounted for directing light in a desired direction.

8. The display assembly of claim 7 wherein said LEDs each includes a pair of electrical contact leads for extending through said carrier plate.

9. The display assembly of claim 8 including a series of lead openings extending through said mounting steps from a top side of said carrier plate to a bottom side of said carrier plate, wherein said electrical contact leads of said LEDs extend through said lead openings in said mounting steps and out said bottom side of said carrier plate.

10. The display assembly of claim 9 including a metal fret disposed on said bottom side of said carrier plate, said metal fret including a corresponding series of fret lead openings receiving said electrical contact leads from said LEDs, wherein said electrical contact leads are secured to said metal fret in electrical communication to secure said LED to said mounting steps and interconnect said LEDs to provide power for lighting said LEDs.

11. The display assembly of claim 10 including a protective covering over said bottom side of said carrier plate and said metal fret to form a generally airtight seal with said carrier plate that encloses and secures said metal fret on said bottom side of said carrier plate.

12. The display assembly of claim 7 including a stabilizing member securing said LEDs to said mounting steps.

13. The display assembly of claim 12 wherein said stabilizing member comprises a silicone adhesive coating applied around a base portion of each of said LEDs to prevent accidental repositioning and provide anti-vibration resistance.

14. The display assembly of claim 7 including a vibration dampening member disposed between each of said LEDs and said mounting steps for relieving stress tensions associated with assembly and damage from vehicle vibrations during use.

15. An indicator display assembly for mounting to an interior side of a vehicle mirror face, comprising:

a carrier plate for mounting to a vehicle mirror face;

an LED array mounted on a top side of said carrier plate;

a series of lead openings extending through said carrier plate from said top side to a bottom side of said carrier plate receiving electrical contact leads from said LED array which extend out said bottom side of said carrier plate; and, a metal fret disposed on said bottom side of said carrier plate connecting said electrical contact leads of said LED array in electrical communication to power said LED array.

16. The display assembly of claim 15 including a vibration dampening member disposed between each LED of said LED array and said carrier plate for relieving stress tensions associated with assembly and damage from vehicle vibrations during use.

17. The display assembly of claim 15 including a protective covering over said bottom side of said carrier plate and said metal fret to form a generally airtight seal with said carrier plate that encloses and secures said metal fret on said bottom side of said carrier plate.

18. The display assembly of claim 15 including a stabilizing member securing said LED array to said carrier plate.

19. The display assembly of claim 18 wherein said stabilizing member comprises a silicone adhesive coating applied around a base portion of each LED in said LED array to prevent accidental repositioning and provide anti-vibration resistance.

20. The display assembly of claim 15 wherein said top side of said carrier plate includes a series of mounting steps skewed relative to said bottom side of said carrier plate so that each LED in said LED array is carried at an angle for directing light in a desired direction through said vehicle mirror face when mounted.

* * * * *